United States Patent [19]

Keir

[11] Patent Number: 5,467,400
[45] Date of Patent: Nov. 14, 1995

[54] SOLID STATE AUDIO AMPLIFIER EMULATING A TUBE AUDIO AMPLIFIER

[75] Inventor: Bruce Keir, Milton Keynes, United Kingdom

[73] Assignee: Marshall Amplification Plc, Milton Keynes, United Kingdom

[21] Appl. No.: 87,767

[22] PCT Filed: Jan. 14, 1992

[86] PCT No.: PCT/GB92/00075

§ 371 Date: Jan. 18, 1994

§ 102(e) Date: Jan. 18, 1994

[87] PCT Pub. No.: WO92/13388

PCT Pub. Date: Aug. 6, 1992

[30] Foreign Application Priority Data

Jan. 17, 1991 [GB] United Kingdom .................... 9101038

[51] Int. Cl.$^6$ ..................................................... H03G 3/00
[52] U.S. Cl. ................................................ 381/61; 381/98
[58] Field of Search ......................................... 381/61, 98

[56] References Cited

FOREIGN PATENT DOCUMENTS

| | | |
|---|---|---|
| 0050067 | 4/1982 | European Pat. Off. . |
| 0181608 | 5/1986 | European Pat. Off. . |
| 2068680 | 8/1981 | United Kingdom . |
| 2103004 | 2/1983 | United Kingdom . |

OTHER PUBLICATIONS

*Electronic Engineering* v. 50 No. 608, Jun. 1978, pp. 17–19 J. E. Morris "Active Filter Using Norton Op–Amp Gyrators".

*Primary Examiner*—Stephen Brinich
*Attorney, Agent, or Firm*—Hodgson, Russ, Andrews, Woods & Goodyear

[57] ABSTRACT

A solid state audio amplifier for connection with a loudspeaker cabinet or emulation thereof to provide amplification characteristics emulating in frequency response those of a valve audio amplifier driving a loudspeaker cabinet. The loudspeaker cabinet comprises a loudspeaker drive and its enclosure. The frequency response of the audio amplifier exhibits a low frequency resonant peak in gain representing the fundamental resonance of the loudspeaker cabinet and a monotonic increase in gain at higher frequency associated with the impedance provided voice coil inductance of the loudspeaker cabinet. The audio amplifier comprises an amplifier and gain control circuitry associated therewith. The amplifier comprises a differential amplifier and the gain control circuitry comprises a impedance network connected in feedback. The impedance network comprises a tuned circuit connected to create the low frequency resonant peak in gain and a reactance providing the increase in gain at higher frequency. The tuned circuit comprises a capacitance and a gyrator circuit simulating an inductance and the reactance comprises a capacitance.

6 Claims, 3 Drawing Sheets

5,467,400

SOLID STATE AUDIO AMPLIFIER EMULATING A TUBE AUDIO AMPLIFIER

BACKGROUND OF THE INVENTION

This invention relates to audio amplifiers.

It is well accepted that with electrically amplified guitar and similar music, the characteristics of the amplification circuitry and loudspeakers play a fundamental role in attaining the desired sound. Since the 1960's, valve-based guitar amplifiers driving traditionally constructed guitar-type loudspeaker cabinets, have become associated with a characteristic and highly regarded sound quality. These electrical valve amplifiers remain in high demand in particular sectors of the music industry, despite the fact that valve technology is regarded as obsolete in many other electrical fields.

Numerous attempts have been made to emulate, using solid-state circuitry, the characteristic sound of a valve amplifier and traditional loudspeaker cabinet. Efforts have been made to produce line level audio signals which when reproduced through headphones, recording equipment or full range linear loudspeakers, simulate the sound achieved with a traditional loudspeaker cabinet. Thus, solid state guitar amplifiers are available with distortion effects deliberately introduced to imitate the distortion inherent in valve amplifiers. Loudspeaker emulaters have been proposed (see for example WO 88/00410) which provide a valve amplifier with a reactive load impedance equivalent to that of a traditional loudspeaker cabinet and which filter the audio signal in simulation of the frequency response of a loudspeaker.

This invention is directed to solid state amplifiers which can be used either to drive traditional loudspeaker cabinets or, with appropriate loudspeaker emulation, to provide line level signals. It is an object of this invention to provide an improved solid-state amplifier or amplifier stage which reproduces more faithfully the output of a valve amplifier driving a traditional loudspeaker cabinet.

It has been found by the present inventor that when driving either a traditional loudspeaker cabinet or a loudspeaker emulator, it is not enough for a solid state amplifier to simulate the distortion and related characteristics of a valve amplifier. It is now recognised that the complex load impedance provided by a traditional loudspeaker cabinet has—by virtue of the comparable output impedance of the valve amplifier—a marked effect upon the effective gain of the amplifier. If the valve amplifer is replaced by a solid state amplifier which has the identical "bench" characteristics but a low output impedance, this frequency-dependent gain effect is lost. There is accordingly a degradation in sound quality irrespective of whether the amplifier is used to drive a traditional loudspeaker cabinet or an appropriate emulation.

An approach to this problem is to provide a solid state amplifier with an artificially high output impedance. There are, however, significant problems with this approach. For example, a resistive load connected in series with the amplifier output will dissipate unacceptable high power levels. Alternatives exist but it is still desirable to retain the low output impedance normally associated with solid state technology.

SUMMARY OF THE INVENTION

It is accordingly a,n object of this invention to provide an improved audio amplifier stage which provides, without high output impedance, an audio signal simulating in the respects in question the output of a valve amplifier when driving a traditional loudspeaker cabinet. That audio signal can optionally be used with a traditional loudspeaker cabinet or appropriate loudspeaker emulation.

Accordingly the present invention consists in one aspect in solid state audio amplifier means for connection with a loudspeaker cabinet or emulation thereof to provide amplification characteristics emulating in frequency response those of a valve audio amplifier driving a loudspeaker cabinet, wherein the frequency response of the audio amplifier means is adapted to exhibit a low frequency resonant peak in gain representing the fundamental resonance of the loudspeaker cabinet and a monotonic increase in gain at higher frequency associated with the voice coil inductance of the loudspeaker cabinet.

Preferably, the audio amplifier means comprises an amplifier and gain control circuitry associated therewith.

Advantageously, said amplifier comprises a differential amplifier and said gain control circuitry comprises a impedance network connected in feedback.

Preferably, said impedance network comprises a tuned circuit connected as to create said low frequency resonant peak in gain and a reactance providing said increase in gain at higher frequency.

Suitably, said tuned circuit comprises a capacitance and a gyrator circuit simulating an inductance and said reactance comprises a capacitance.

The present invention will now be described by way of example with reference to the accompanying drawings in which:

DETAILED DESCRIPTION OF THE ILLUSTRATED EMBODIMENTS

Figure 1:
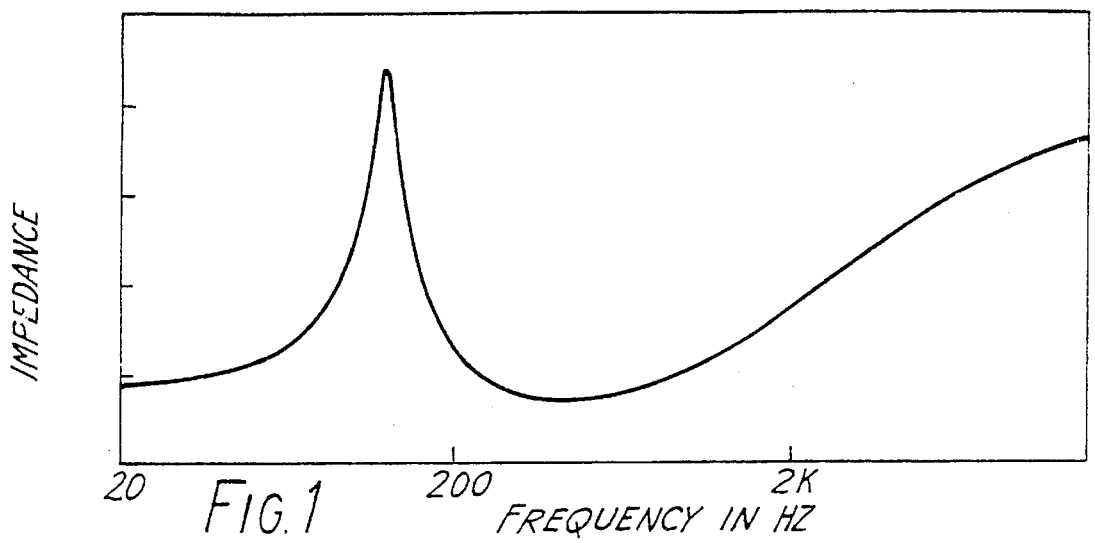
FIG. 1 is a plot of impedance versus frequency for a typical loudspeaker cabinet of traditional construction.

Whilst a loudspeaker has a nominal impedance rating of—say—8 ohms, this value generally only applies over a small, mid-frequency range. At higher and lower frequencies there are considerable variations in impedance which are characteristic of the loudspeaker and its enclosure. There is shown in FIG. 1, a plot of impedance versus frequency for a MARSHALL (Registered Trade Mark) 4×12 loudspeaker cabinet. The plot is logarithmic and it will be seen that there is a peak in impedance at low frequency. This is due to the fundamental resonance of the loudspeaker drive unit and its enclosure. At frequencies above 400–500 HZ the impedance continues to rise with frequency, because of the inductance associated with the loudspeaker voice coil.

Figure 2:
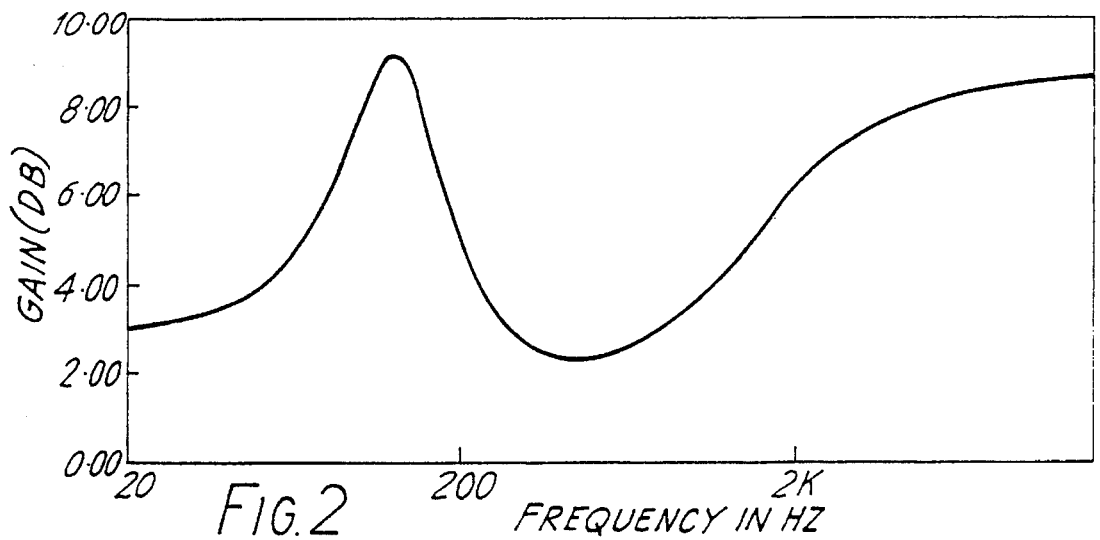
FIG. 2 is a plot of gain versus frequency for a typical valve amplifier driving the loudspeaker cabinet of FIG. 1.

It will be apparent that the voltage developed at the output terminals of a power amplifier will depend upon the output impedance of the amplifier and the impedance of the loudspeaker, as illustrated for example in FIG. 1. If the output impedance of the amplifier is small, then changes in the value of the loudspeaker impedance will have only a small effect on the output voltage. Conversely, if the output impedance of the amplifier is comparable with the loudspeaker impedance, changes in the value of the output impedance will then have a significant effect on the output voltage of the amplifier. This latter situation applies, as has been explained, to a valve amplifier, with the effect that the response of the amplifier shows a marked frequency dependence. There is shown in FIG. 2, by way of illustration, a plot of the gain of a 100 watt MARSHALL (Registered Trade Mark) power amplifier driving a loudspeaker cabinet as mentioned above. If a solid-state amplifier of low output impedance were to be used to drive the identical loudspeaker cabinet, the sound would be degraded through loss of this characteristic frequency response.

Figure 3:
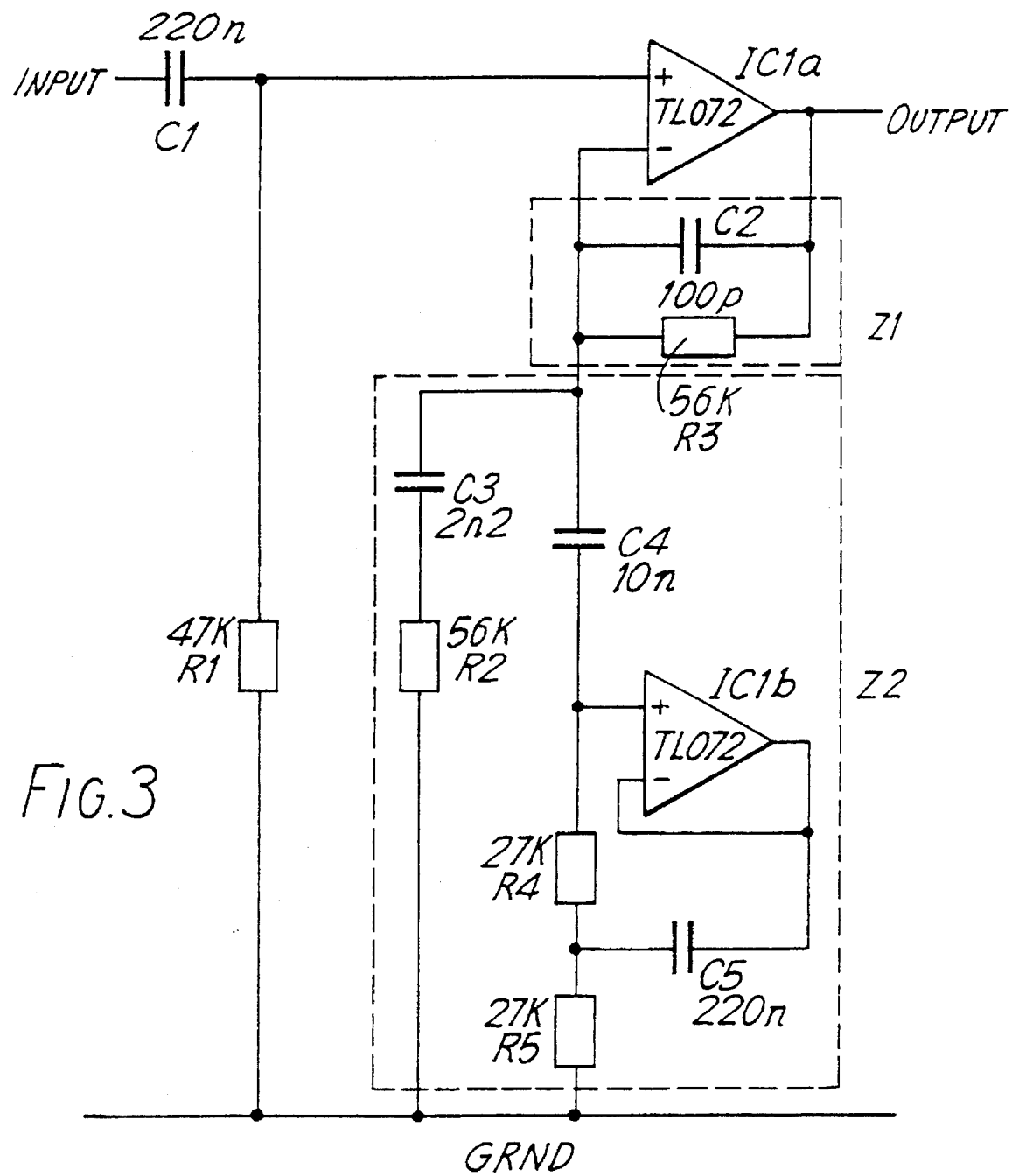
FIG. 3 is a circuit diagram of an amplifier stage according to the present invention.

There is shown in FIG. 3 an amplifier stage according to this invention which provides a good approximation to this characteristic frequency response.

The circuit is based on a differential amplifier IC1a used in non-inverting mode. An input signal is applied via capacitor C1 to remove any DC components, with resistor R1 providing a bias path to ground.

The gain of the amplifier IC1a is controlled in feedback. For the purposes of explanation, the components may be grouped, as shown in the figure in dotted outline, in complex impedances Z1 and Z2. It will then be understood that the gain of the amplifier is given by:

$$\frac{Vo}{Vin} = \frac{Z1 + Z2}{Z2} \quad (1)$$

The effective impedance Z1 comprises principally resistor R3. Capacitor C2 is provided in parallel with the resistor R3 for a purpose which is not germane to the present invention. In conventional manner, capacitor C2 provides for a roll-off in the gain of the amplifier above the frequency range of interest.

Effective inductance Z2 comprises two parallel connected paths. One path comprises capacitor C3 and resistor R2 connected in series between the inverting input of the amplifier IC1a and ground. The other path comprises the series connection of capacitor C4 and a gyrator circuit serving the function of an inductance.

More specifically, the gyrator circuit comprises resistors R4 and R5 connected in series between capacitor C4 and ground. A differential amplifier IC1b has its non-inverting input connected to the junction of capacitor C4 and resistor R4. The inverting input is connected in feedback to the output, which is connected in turn through capacitor C5 with the junction of resistor R4 and R5. In a manner which is known per se, this circuit simulates an inductor. At low frequencies, capacitor C5 is essentially open-circuit so that the impedance of the gyrator circuit is determined by resistors R4 and R5. At higher frequencies, the function of the differential amplifier will be to apply at the junction of resistor R4 and R5, essentially the same voltage appearing at the junction of capacitor C4 and resistor R4. Thus at high frequencies, there is no voltage drop across resistor R4, no current flows and the effective impedance is high, as with an inductor.

The combination of capacitor 4 with the described gyrator circuit provides a series tuned circuit having, in this specific example, a centre frequency of approximately 125 HZ and a Q factor of 2.3. It will be recognised that the impedance of the series tuned circuit falls to a minimum at the resonant frequency.

The frequency dependence of the combined inductance Z2 can now be understood. At low frequency, capacitor C3 is effectively open-circuit so that the series tuned circuit is dominant. As explained, this impedance shows a resonant drop at approximately 125 HZ. As will be clear from the equation (1), the effect of a drop in Z2 is to increase the gain of the amplifier stage. Thus a low frequency peak in amplifier gain is produced, as desired.

At high frequencies, the path containing capacitor C3 and resistor R2 will dominate, producing a capacitative drop in impedance with frequency. A decrease in Z2 produces an increase in the gain of the amplifier, so that a steady increase in gain at higher frequencies is provided, again as desired.

Figure 4:
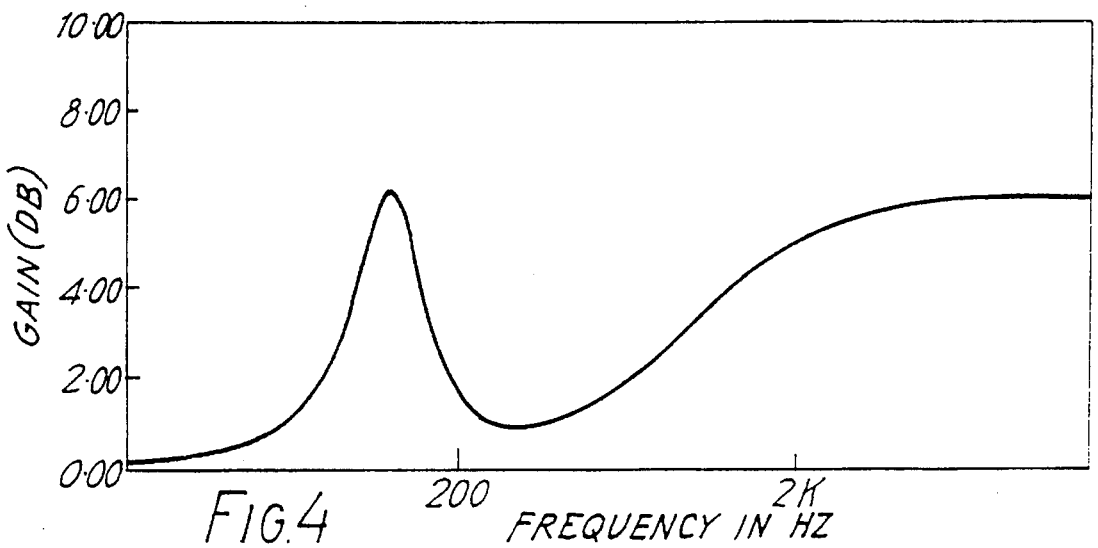
FIG. 4 is a plot of gain versus frequency showing the response of the circuit shown in FIG. 3.

These qualitative phenomenon are illustrated quantitatively in FIG. 4 which plots the frequency response of the circuit shown in FIG. 3. A comparison between FIGS. 2 and 4 will show that the amplifier stage according to the invention has had the desired effect of emulating the frequency response of a high output impedance valve amplifier connected with a traditional loudspeaker cabinet.

The output of the amplifier stage shown in FIG. 3 will typically be used with appropriate loudspeaker emulation to drive headphones, recording equipment or other linear transducers. At appropriate power levels, however, the amplifier stage according to this invention can be used to drive conventional loudspeaker cabinets.

The described circuit is of course only one example of the manner in which the gain of the amplifier can be controlled so as to produce the desired frequency of response. In a simple modification, the described gyrator circuit can be replaced by a true inductance although this is likely to be less compact and more expensive. In a more radical modification, the circuit can be arranged so that gain is controlled through the combined impedance Z1. Thus, for example, in the circuit of FIG. 5, Z1 comprises two parallel arms. A first arm comprises the series connection of an inductor L1 with a parallel tuned circuit of inductor L2 and capacitor C2. The second arm comprises resistor R1. Inductance Z2 is formed by resistor R2. At low frequencies, the impedance of inductor L1 is low so that the behaviour of combined impedance Z1 is dominated by the parallel tuned circuit. This is selected to have a resonance at a low frequency (typically 125 HZ). The impedance of a parallel tuned circuit is at a maximum at resonance, giving the required resonant peak in gain at low frequency. At higher frequencies, the inductor L1 will dominate, providing a steady increase in the value of impedance Z1 and thus a steady increase in gain, according to the desired characteristic. Resistor R1 serves to prevent gain moving to infinity in the case of lossless inductors.

The skilled man will appreciate that it will be possible to drive a differential amplifier in the inverting mode, with appropriate feedback control to produce the desired gain characteristic.

Figure 6:
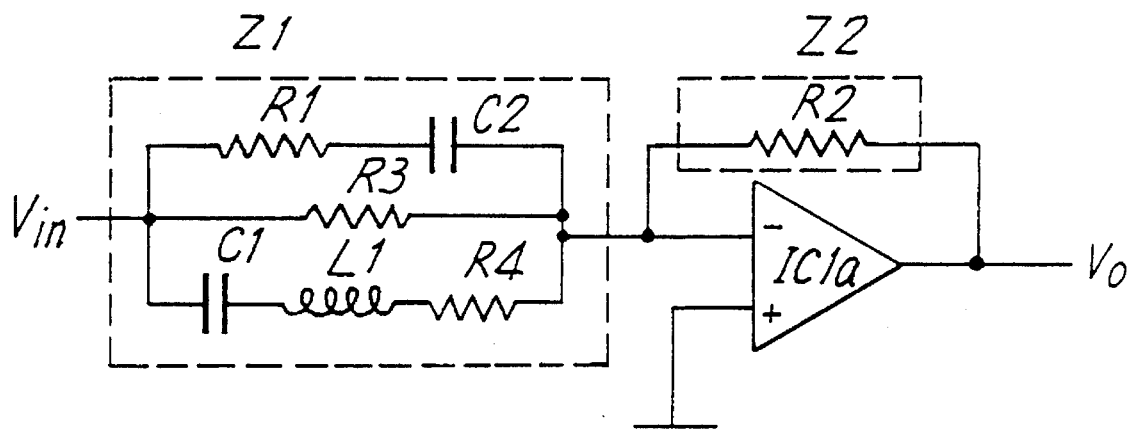

Reference is directed, for example, to FIG. 6 in which the input signal Vin is taken through an impedance network Z1 to the inverting input of a differential amplifier IC1a. The non-inverting input is taken to ground and negative feedback is applied through impedance network 22 in the form of resistor R2. In this arrangement it will be understood that the gain of the amplifier stage is given by $$\frac{Vo}{Vin} = \frac{Z2}{Z1} \quad (2)$$

The impedance network Z1 comprises three parallel arms, one consisting of a series tuned circuit C1, L1 with series resistor R4, the second a resistor R1 in series with capacitor C2, and the third a resistor R3.

The behaviour of impedance Z1 determines the frequency response. At low frequency, C2 is effectively open circuit and the resonant drop in impedance of the series tuned circuit C1, L1 provides the desired resonant peak in gain. At higher frequencies, the diminishing impedance of C2 provides the desired steady increase in gain. Resistors R3 and R4 serve to keep the gain within range, in the case of lossless inductors and capacitors.

Figure 5:
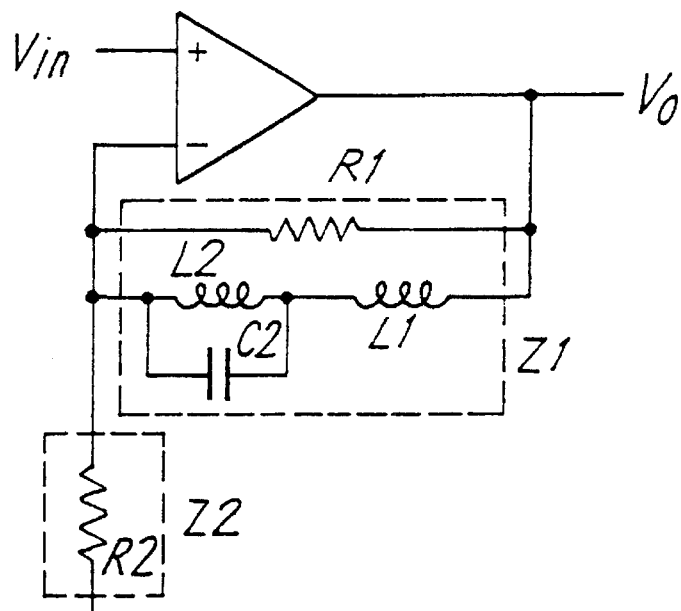
FIGS. 5 and 6 are circuit diagrams of amplifier stages according to further embodiments of this invention.

It will be recognised that, by analogy with FIG. 5, the gain of an amplifier driven in non-inverting mode can similarly be controlled through impedance Z2. Thus, a parallel tuned circuit can provide the necessary resonant increase in impedance, with an inductance producing a steady increase in impedance with frequency. The inductance may of course be in the form of a gyrator circuit.

Generally, it is more convenient to employ capacitors rather than inductors and to use gyrator circuits simulating inductance, rather than true inductors.

Still further alternatives will occur to the skilled man in this art, by which the gain of the amplifier can be controlled to produce the desired resonant increase in gain at low frequency associated with the fundamental resonance of the loudspeaker cabinet, and the monotonic increase in gain at higher frequencies associated with the voice coil inductance of the loudspeaker. Although, it will often be more convenient to employ feedback or other gain control circuitry to give the desired amplifier frequency response, the alternative exists of combining an amplifier with circuitry providing controlled attenuation over specified frequency bands.

I claim:

1. Solid state audio amplifier means for connection with a loudspeaker cabinet or emulation thereof to provide amplification characteristics emulating in frequency response those of a valve audio amplifier driving a loudspeaker cabinet, said loudspeaker cabinet comprising a loudspeaker drive and the enclosure thereof, so that when said solid state audio amplifier means is connected to said loudspeaker drive the frequency response of the audio amplifier means exhibits a low frequency resonant peak in gain representing the fundamental resonance of the loudspeaker cabinet comprising said loudspeaker drive and said enclosure and a monotonic increase in gain at higher frequency associated with the impedance provided by voice coil inductance of the loudspeaker cabinet comprising said loudspeaker drive and said enclosure.

2. Amplifier means according to claim 1, comprising an amplifier and gain control circuitry associated therewith.

3. Amplifier means according to claim 2, wherein said amplifier comprises a differential amplifier and said gain control circuitry comprises a impedance network connected in feedback.

4. Amplifier means according to claim 3, wherein said impedance network comprises a tuned circuit connected as to create said low frequency resonant peak in gain and a reactance providing said increase in gain at higher frequency.

5. Amplifier means according to claim 4, wherein said tuned circuit comprise: a capacitance and a gyrator circuit simulating an inductance and said reactance comprises a capacitance.

6. Audio amplifier means according to claim 1 in combination with the loudspeaker cabinet comprising said loudspeaker drive and said enclosure, wherein said audio amplifier means is connected to said loudspeaker drive.

\* \* \* \* \*